(12) United States Patent
Paseuth et al.

(10) Patent No.: US 9,878,374 B2
(45) Date of Patent: Jan. 30, 2018

(54) SURFACE-COATED CUTTING TOOL

(71) Applicant: SUMITOMO ELECTRIC HARDMETAL CORP., Itami-shi (JP)

(72) Inventors: Anongsack Paseuth, Sorachi-gun (JP); Hideaki Kanaoka, Sorachi-gun (JP); Takanori Detani, Sorachi-gun (JP); Shinya Imamura, Sorachi-gun (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 0 days.

(21) Appl. No.: 15/039,999

(22) PCT Filed: Jul. 13, 2015

(86) PCT No.: PCT/JP2015/070029
§ 371 (c)(1),
(2) Date: May 27, 2016

(87) PCT Pub. No.: WO2017/009928
PCT Pub. Date: Jan. 19, 2017

(65) Prior Publication Data
US 2017/0189968 A1 Jul. 6, 2017

(51) Int. Cl.
*B23B 27/14* (2006.01)
*C30B 25/14* (2006.01)
*C30B 25/10* (2006.01)
*C30B 29/20* (2006.01)
*C30B 33/02* (2006.01)
*C23C 16/36* (2006.01)
*C23C 16/40* (2006.01)
*C23C 16/56* (2006.01)

(52) U.S. Cl.
CPC ............ *B23B 27/148* (2013.01); *C23C 16/36* (2013.01); *C23C 16/403* (2013.01); *C23C 16/56* (2013.01); *C30B 25/10* (2013.01); *C30B 25/14* (2013.01); *C30B 29/20* (2013.01); *C30B 33/02* (2013.01); *B23B 2224/04* (2013.01); *B23B 2224/32* (2013.01); *B23B 2228/04* (2013.01); *B23B 2228/105* (2013.01)

(58) Field of Classification Search
USPC .......... 51/307, 309; 428/336, 698, 601, 702; 407/119
See application file for complete search history.

(56) References Cited

U.S. PATENT DOCUMENTS 7,597,511 B2 10/2009 Tomita et al.
2006/0188747 A1 8/2006 Honma et al.
2007/0116985 A1 5/2007 Osada et al.
2009/0269150 A1 10/2009 Omori et al.
2010/0260561 A1* 10/2010 Moriguchi .......... C23C 14/0036 407/119
2012/0003452 A1 1/2012 Tomita et al.
2014/0193622 A1* 7/2014 Stiens ................... C23C 16/403 428/216

FOREIGN PATENT DOCUMENTS

| JP | 56-42412 B2 | 10/1981 |
|---|---|---|
| JP | 2004-122264 A | 4/2004 |
| JP | 2006-198735 A | 8/2006 |
| JP | 2006-326713 A | 12/2006 |
| JP | 2011-200953 | * 10/2011 |
| JP | 2014-018886 A | 2/2014 |
| JP | 2014-526391 A | 10/2014 |
| WO | WO-2010/106811 A1 | 9/2010 |
| WO | WO-2014/132995 A1 | 9/2014 |

OTHER PUBLICATIONS

Notice of Grounds of Rejection in Japanese Patent Application No. 2015-548512, dated Nov. 10, 2015.
Decision to Grant Patent in Japanese Patent Application No. 2015-548512, dated Dec. 15, 2015.
International Search Report in PCT International Application No. PCT/JP2015/070029, dated Sep. 15, 2015.
International Search Report in PCT International Application No. PCT/JP2015/070028, dated Sep. 15, 2015.
International Search Report in PCT International Application No. PCT/JP2015/070030, dated Sep. 15, 2015.
U.S. Appl. No. 15/039,988, filed May 27, 2016.
U.S. Appl. No. 15/100,008, filed May 27, 2016.
Office Action in U.S. Appl. No. 15/039,988, dated May 9, 2017.
Office Action in U.S. Appl. No. 15/100,008, dated May 11, 2017.
Notice of Allowance issued in U.S. Appl. No. 15/039,988, dated Sep. 27, 2017 [Provided in IFW].
Notice of Allowance issued in U.S. Appl. No. 15/100,008, dated Sep. 26, 2017 [Provided in IFW].

* cited by examiner

*Primary Examiner* — Archene Turner
(74) *Attorney, Agent, or Firm* — Venable LLP; Michael A. Sartori; Miguel A. Lopez

(57) ABSTRACT

A surface-coated cutting tool according to the present invention is provided with a base material and a coating formed on the base material, the coating includes an $\alpha$-$Al_2O_3$ layer, the $\alpha$-$Al_2O_3$ layer includes a plurality of crystal grains of $\alpha$-$Al_2O_3$ and shows (001) orientation, a grain boundary of the crystal grains contains a CSL grain boundary and a general grain boundary, and a length of a $\Sigma 3$ crystal grain boundary out of the CSL grain boundary exceeds 80% of a length of a $\Sigma 3$-29 crystal grain boundary and is equal to or more than 10% and equal to or less than 50% of the total length of all grain boundaries which is the sum of the length of the $\Sigma 3$-29 crystal grain boundary and a length of the general grain boundary.

7 Claims, No Drawings

SURFACE-COATED CUTTING TOOL

TECHNICAL FIELD

The present invention relates to a surface-coated cutting tool.

BACKGROUND ART

A surface-coated cutting tool having a coating formed on a base material has conventionally been used. For example, Japanese Patent Laying-Open No. 2006-198735 (PTD 1) discloses a surface-coated cutting tool having a coating including an $\alpha$-$Al_2O_3$ layer in which a ratio of a $\Sigma 3$ crystal grain boundary in a $\Sigma 3$-29 crystal grain boundary is 60 to 80%.

Japanese National Patent Publication No. 2014-526391 (PTD 2) discloses a surface-coated cutting tool having a coating including an $\alpha$-$Al_2O_3$ layer in which a length of a $\Sigma 3$ crystal grain boundary exceeds 80% of a length of a $\Sigma 3$-29 crystal grain boundary.

CITATION LIST

Patent Document

PTD 1: Japanese Patent Laying-Open No. 2006-198735
PTD 2: Japanese National Patent Publication No. 2014-526391

SUMMARY OF INVENTION

Technical Problem

As a ratio of a $\Sigma 3$ crystal grain boundary in grain boundaries included in an $\alpha$-$Al_2O_3$ layer is higher in a coating including the $\alpha$-$Al_2O_3$ layer composed of polycrystalline $\alpha$-$Al_2O_3$, various characteristics represented by mechanical characteristics improve and hence resistance to wear and resistance to breakage are improved. It is thus expected that a cutting tool is longer in life.

In recent working by cutting, however, a speed and efficiency have become high, load imposed on a cutting tool has increased, and life of the cutting tool has disadvantageously become short. Therefore, further improvement in mechanical characteristics of a coating on the cutting tool and longer life of the cutting tool have been demanded.

The present invention was made in view of such circumstances, and an object thereof is to provide a surface-coated cutting tool achieving improved mechanical characteristics of a coating and longer life.

Solution to Problem

A surface-coated cutting tool according to one embodiment of the present invention is provided with a base material and a coating formed on the base material, the coating includes an $\alpha$-$Al_2O_3$ layer, the $\alpha$-$Al_2O_3$ layer includes a plurality of crystal grains of $\alpha$-$Al_2O_3$ and shows (001) orientation, a grain boundary of the crystal grains contains a CSL grain boundary and a general grain boundary, and a length of a $\Sigma 3$ crystal grain boundary out of the CSL grain boundary exceeds 80% of a length of a $\Sigma 3$-29 crystal grain boundary and is equal to or more than 10% and equal to or less than 50% of the total length of all grain boundaries which is the sum of the length of the $\Sigma 3$-29 crystal grain boundary and a length of the general grain boundary.

Advantageous Effects of Invention

According to the above, mechanical characteristics of a coating can be improved and life of a cutting tool can further be longer.

DESCRIPTION OF EMBODIMENTS

[Description of Embodiments of Present Invention]
Embodiments of the present invention will initially be listed and described.

[1] A surface-coated cutting tool according to one embodiment of the present invention is provided with a base material and a coating formed on the base material, the coating includes an $\alpha$-$Al_2O_3$ layer, the $\alpha$-$Al_2O_3$ layer includes a plurality of crystal grains of $\alpha$-$Al_2O_3$ and shows (001) orientation, a grain boundary of the crystal grains contains a CSL grain boundary and a general grain boundary, and a length of a $\Sigma 3$ crystal grain boundary out of the CSL grain boundary exceeds 80% of a length of a $\Sigma 3$-29 crystal grain boundary and is equal to or more than 10% and equal to or less than 50% of the total length of all grain boundaries which is the sum of the length of the $\Sigma 3$-29 crystal grain boundary and a length of the general grain boundary. This surface-coated cutting tool achieves improved mechanical characteristics of a coating and longer life.

[2] Preferably, the CSL grain boundary is constituted of the $\Sigma 3$ crystal grain boundary, a $\Sigma 7$ crystal grain boundary, a $\Sigma 11$ crystal grain boundary, a $\Sigma 17$ crystal grain boundary, a $\Sigma 19$ crystal grain boundary, a $\Sigma 21$ crystal grain boundary, a $\Sigma 23$ crystal grain boundary, and a $\Sigma 29$ crystal grain boundary, and the length of the $\Sigma 3$-29 crystal grain boundary is a total sum of lengths of the $\Sigma 3$ crystal grain boundary, the $\Sigma 7$ crystal grain boundary, the $\Sigma 11$ crystal grain boundary, the $\Sigma 17$ crystal grain boundary, the $\Sigma 19$ crystal grain boundary, the $\Sigma 21$ crystal grain boundary, the $\Sigma 23$ crystal grain boundary, and the $\Sigma 29$ crystal grain boundary, which constitute the CSL grain boundary. The effect above is thus sufficiently exhibited.

[3] Preferably, the $\alpha$-$Al_2O_3$ layer has a thickness from 2 to 20 μm. The characteristics above are thus most effectively exhibited.

[4] Preferably, the $\alpha$-$Al_2O_3$ layer has surface roughness Ra less than 0.2 μm. Thus, adhesive wear between a work material and a cutting edge of the tool is suppressed and consequently resistance to chipping of the cutting edge is improved.

[5] Preferably, the $\alpha$-$Al_2O_3$ layer includes a point where an absolute value for compressive stress is maximal, in a region within 2 μm from a surface side of the coating, and the absolute value for compressive stress at the point is lower than 1 GPa. Thus, breakage of the cutting edge of the tool due to mechanical and thermal fatigue which occurs during an intermittent cutting process is suppressed and consequently reliability of the cutting edge is improved.

[6] Preferably, the coating includes a $TiC_xN_y$ layer between the base material and the $\alpha$-$Al_2O_3$ layer, and the $TiC_xN_y$ layer contains $TiC_xN_y$ satisfying atomic ratio relation of $0.6 \leq x/(x+y) \leq 0.8$. Adhesion between the base material and the $\alpha$-$Al_2O_3$ layer is thus improved.

[Details of Embodiments of Present Invention]

Embodiments of the present invention (hereinafter also denoted as the "present embodiment") will be described in further detail below.

<Surface-Coated Cutting Tool>

The surface-coated cutting tool according to the present embodiment is provided with a base material and a coating formed on the base material. Though such a coating preferably covers the entire surface of the base material, a part of the base material being not covered with the coating or a partially different construction of the coating does not depart from the scope of the present embodiment.

The surface-coated cutting tool in the present embodiment can suitably be employed as a cutting tool such as a drill, an end mill, a throwaway tip for a drill, a throwaway tip for an end mill, a throwaway tip for milling, a throwaway tip for turning, a metal saw, a gear cutting tool, a reamer, and a tap.

<Base Material>

For a base material for the surface-coated cutting tool in the present embodiment, any conventionally known base material of such a kind can be employed. Such a base material is preferably exemplified by cemented carbide (for example, WC-based cemented carbide, which contains not only WC but also Co, or to which a carbonitride of Ti, Ta, or Nb may be added), cermet (mainly composed of TiC, TiN, or TiCN), high-speed steel, ceramics (titanium carbide, silicon carbide, silicon nitride, aluminum nitride, or aluminum oxide), a cubic boron nitride sintered object, or a diamond sintered object.

Among these various base materials, in particular, WC-based cemented carbide or cermet (in particular, TiCN-based cermet) is preferably selected. This is because such base materials are particularly excellent in balance between hardness and strength at a high temperature and have characteristics excellent as a base material for the surface-coated cutting tool in applications above.

When a surface-coated cutting tool is implemented as a throwaway chip, a base material thereof may or may not have a chip breaker, and a cutting edge ridgeline portion may have a sharp edge (a ridge at which a rake face and a flank face intersect with each other), may be honed (a sharp edge provided with R), may have a negative land (beveled), and may be honed and have a negative land.

<Coating>

The coating according to the present embodiment may include other layers so long as it includes an $\alpha$-$Al_2O_3$ layer. Examples of other layers can include a TiN layer, a TiCN layer, a TiBNO layer, a TiCNO layer, a $TiB_2$ layer, a TiAlN layer, a TiAlCN layer, a TiAlON layer, and a TiAlONC layer. An order of layering is not particularly limited.

In the present embodiment, a chemical formula such as "TiN", "TiCN," or "$TiC_xN_y$" in which an atomic ratio is not particularly specified in the present embodiment does not indicate that an atomic ratio of each element is limited only to "1" but encompasses all conventionally known atomic ratios.

Such a coating according to the present embodiment has a function to improve various characteristics such as resistance to wear and resistance to chipping by covering the base material.

Such a coating according to the present embodiment has a thickness suitably of 3-30 µm (not smaller than 3 µm and not greater than 30 µm; a numerical range expressed with "-" in the present application refers to a range including upper limit and lower limit numeric values) and more preferably of 5-20 µm. When a thickness is smaller than 3 µm, resistance to wear may be insufficient, and when the thickness exceeds 30 µm, peel-off or destruction of the coating may occur with high frequency during intermittent working, with application of a large stress between the coating and the base material.

<$\alpha$-$Al_2O_3$ Layer>

The coating according to the present embodiment includes an $\alpha$-$Al_2O_3$ layer. The coating can include one $\alpha$-$Al_2O_3$ layer or two or more $\alpha$-$Al_2O_3$ layers.

The $\alpha$-$Al_2O_3$ layer contains a plurality of crystal grains of $\alpha$-$Al_2O_3$ (aluminum oxide of which crystal structure is of an $\alpha$ type). Namely, this layer is composed of polycrystalline $\alpha$-$Al_2O_3$. Normally, these crystal grains have a grain size approximately from 100 to 2000 nm.

The $\alpha$-$Al_2O_3$ layer shows (001) orientation. Here, "showing (001) orientation" refers to such a condition that a ratio of crystal grains ($\alpha$-$Al_2O_3$) of which normal direction to a (001) plane is within ±20° with respect to a normal direction to a surface of the $\alpha$-$Al_2O_3$ layer (a surface located on a surface side of the coating) is not lower than 50% in the $\alpha$-$Al_2O_3$ layer. Specifically, it refers to such a condition that, when a vertical cross-section of the $\alpha$-$Al_2O_3$ layer (a cross-section in parallel to the normal direction to the surface of the $\alpha$-$Al_2O_3$ layer) is observed with a scanning electron microscope (SEM) known as electron beam backscattering diffraction (EBSD) which will be described later and a result thereof is subjected to image processing with color mapping, an area ratio of the above-described crystal grains in the $\alpha$-$Al_2O_3$ layer is not lower than 50%.

A grain boundary of a plurality of crystal grains of $\alpha$-$Al_2O_3$ (hereinafter also simply denoted as a "crystal grain boundary") contains a CSL grain boundary and a general grain boundary, and a length of a $\Sigma3$ crystal grain boundary out of the CSL grain boundary exceeds 80% of a length of a $\Sigma3$-29 crystal grain boundary and is equal to or more than 10% and equal to or less than 50% of the total length of all grain boundaries which is the sum of the length of the $\Sigma3$-29 crystal grain boundary and a length of the general grain boundary. Thus, the coating ($\alpha$-$Al_2O_3$ layer) according to the present embodiment can achieve improved mechanical characteristics and hence longer life of the cutting tool.

The crystal grain boundary significantly affects characteristics of a substance such as growth of crystal grains, creep characteristics, diffusion characteristics, electric characteristics, optical characteristics, and mechanical characteristics. Important characteristics to be taken into consideration include, for example, a density of crystal grain boundaries in a substance, a chemical composition of an interface, and a crystallographic texture, that is, a crystal grain boundary plane orientation and crystal misorientation. In particular, a coincidence site lattice (CSL) crystal grain boundary plays a special role. The CSL crystal grain boundary (also simply referred to as a "CSL grain boundary") is characterized by a multiplicity index $\Sigma$, and is defined as a ratio between a density of sites of crystal lattices of two crystal grains in contact with each other at the crystal grain boundary and a density of sites which coincide with each other when the crystal lattices are superimposed on each other. It has generally been admitted that, in a simple structure, a crystal grain boundary having a low $\Sigma$ value tends to have low interface energy and special characteristics. Therefore, control of a ratio of a special crystal grain boundary and a crystal misorientation distribution estimated from a CSL model is considered as important for characteristics of a ceramic coating and a method of improving those characteristics.

A technique based on a scanning electron microscope (SEM) known as electron beam backscattered diffraction (EBSD) has recently appeared and has been used for studies of a crystal grain boundary in a ceramic substance. The EBSD technique is based on automatic analysis of a Kikuchi diffraction pattern generated by backscattered electrons.

A crystallographic orientation of each crystal grain of a substance of interest is determined after indexing of a corresponding diffraction pattern. A texture is analyzed and a grain boundary character distribution (GBCD) is determined relatively easily with EBSD, with the use of commercially available software. Crystal grain boundary misorientation of a sample population having a large interface can be determined by applying EBSD to the interfaces. Misorientation distribution is normally associated with a condition for treatment of a substance. Crystal grain boundary misorientation can be obtained based on a common orientation parameter such as an Euler angle, an angle/axis pair, or a Rodrigues' vector. The CSL model is widely used as a tool for determining characteristics.

The CSL grain boundary in the present embodiment is normally constituted not only of the $\Sigma3$ crystal grain boundary but also of the $\Sigma7$ crystal grain boundary, the $\Sigma11$ crystal grain boundary, the $\Sigma17$ crystal grain boundary, the $\Sigma19$ crystal grain boundary, the $\Sigma21$ crystal grain boundary, the $\Sigma23$ crystal grain boundary, and the $\Sigma29$ crystal grain boundary. Even when any one or more crystal grain boundaries other than the $\Sigma3$ crystal grain boundary are not observed in observation with a scanning electron microscope (SEM) known as electron beam backscattered diffraction (EBSD), such a case does not depart from the scope of the present embodiment so long as an effect of the present embodiment is exhibited.

The $\Sigma3$ crystal grain boundary in the present embodiment is considered as lowest in grain boundary energy among CSL crystal grain boundaries of $\alpha$-$Al_2O_3$, and hence it is considered that mechanical characteristics (in particular, resistance to plastic deformation) can be enhanced by increasing a ratio thereof in all CSL crystal grain boundaries. Therefore, in the present embodiment, the all CSL crystal grain boundaries are denoted as a $\Sigma3$-29 crystal grain boundary, and a length of the $\Sigma3$ crystal grain boundary is defined as exceeding 80% of a length of the $\Sigma3$-29 crystal grain boundary. The length of the $\Sigma3$ crystal grain boundary is more preferably 83% or higher and further preferably 85% or higher of the length of the $\Sigma3$-29 crystal grain boundary. A numeric value is thus preferably as high as possible, and an upper limit thereof does not have to be defined. From a point of view of a thin film being polycrystalline, however, the upper limit is 99% or lower.

Here, the length of the $\Sigma3$ crystal grain boundary refers to a total length of the $\Sigma3$ crystal grain boundary in a field of view observed with EBSD, and the length of the $\Sigma3$-29 crystal grain boundary refers to a total length of the $\Sigma3$-29 crystal grain boundary defined below, in a field of view observed with EBSD. Namely, the length of the $\Sigma3$-29 crystal grain boundary is the total sum of lengths of the $\Sigma3$ crystal grain boundary, the $\Sigma7$ crystal grain boundary, the $\Sigma11$ crystal grain boundary, the $\Sigma17$ crystal grain boundary, the $\Sigma19$ crystal grain boundary, the $\Sigma21$ crystal grain boundary, the $\Sigma23$ crystal grain boundary, and the $\Sigma29$ crystal grain boundary, which constitute the CSL grain boundary.

Since the $\Sigma3$ crystal grain boundary has high conformity as is clear also from the fact that it is low in grain boundary energy, two crystal grains of which grain boundary is defined by the $\Sigma3$ crystal grain boundary exhibit a behavior similar to a behavior of a single crystal or twin crystals and tend to be coarser. As crystal grains are coarser, characteristics of a coating such as resistance to chipping lowers and hence coarsening should be suppressed. Therefore, in the present embodiment, the suppression effect above is ensured by defining the length of the $\Sigma3$ crystal grain boundary to be not lower than 10% and not higher than 50% of the total length of all grain boundaries.

Therefore, when the length of the $\Sigma3$ crystal grain boundary exceeds 50% of the total length of all grain boundaries, crystal grains unfavorably become coarser, and when it is lower than 10%, excellent mechanical characteristics cannot be obtained. A more preferred range is from 20 to 45% and a further preferred range is from 30 to 40%.

Here, all grain boundaries refer to the CSL crystal grain boundary and crystal grain boundaries other than the CSL crystal grain boundary as being added. The crystal grain boundaries other than the CSL crystal grain boundary are called a general grain boundary for the sake of convenience. Therefore, the general grain boundary refers to a remainder resulting from exclusion of the $\Sigma3$-29 crystal grain boundary from all grain boundaries of crystal grains of $\alpha$-$Al_2O_3$ in observation with EBSD. Therefore, the "total length of all grain boundaries" can be expressed as the "sum of the length of the $\Sigma3$-29 crystal grain boundary and the length of the general grain boundary."

In the present embodiment, whether or not the length of the $\Sigma3$ crystal grain boundary exceeds 80% of the length of the $\Sigma3$-29 crystal grain boundary and whether or not the length of the $\Sigma3$ crystal grain boundary is not lower than 10% and not higher than 50% of the total length of all grain boundaries can be determined as follows.

Initially, an $\alpha$-$Al_2O_3$ layer is formed based on a manufacturing method which will be described later. Then, the formed $\alpha$-$Al_2O_3$ layer (including the base material) is cut to obtain a cross-section perpendicular to the $\alpha$-$Al_2O_3$ layer (that is, cut to expose a cut surface obtained by cutting the $\alpha$-$Al_2O_3$ layer along a plane including a normal line to the surface of the $\alpha$-$Al_2O_3$ layer). Thereafter, the cut surface is polished with water resistant sandpaper (which contains an SiC grain abrasive as an abrasive).

The $\alpha$-$Al_2O_3$ layer is cut, for example, in such a manner that the surface of the $\alpha$-$Al_2O_3$ layer (when another layer is formed on the $\alpha$-$Al_2O_3$ layer, a surface of the coating) is fixed with the use of wax or the like as being in intimate contact to a sufficiently large flat plate for holding, and thereafter the $\alpha$-$Al_2O_3$ layer is cut in a direction perpendicular to the flat plate with a cutter with a rotary blade (cut such that the rotary blade and the flat plate are as perpendicular as possible to each other). Any portion of the $\alpha$-$Al_2O_3$ layer may be cut so long as the $\alpha$-$Al_2O_3$ layer is cut in such a perpendicular direction, however, the $\alpha$-$Al_2O_3$ layer is preferably cut such that a tip end portion of a cutting edge as will be described later is included.

The cut surface is polished successively with water resistant sandpaper #400, #800, and #1500 (the number (#) of the water resistant sandpaper means a difference in grain size of the abrasive, and a greater number indicates a smaller grain size of the abrasive).

In succession, the polished surface is further smoothened through ion milling treatment with the use of Ar ions. Conditions for ion milling treatment are as follows.

Acceleration voltage: 6 kV

Irradiation angle: 0° from a direction of normal to the surface of the $\alpha$-$Al_2O_3$ layer (that is, a linear direction in parallel to a direction of thickness of the $\alpha$-$Al_2O_3$ layer at the cut surface)

Irradiation time period: 6 hours

Thereafter, the smoothened polished surface is observed with the SEM with EBSD. Though a location of observation is not particularly limited, the tip end portion of the cutting edge is preferably observed in consideration of relation with cutting characteristics. The tip end portion of the cutting edge normally means a cutting edge ridgeline portion where the rake face and the flank face intersect with each other. When the cutting edge ridgeline portion is honed or beveled, however, any portion in a honed or beveled area is observed.

Zeiss Supra 35 VP (manufactured by CARL ZEISS) including an HKL NL02 EBSD detector is employed as the SEM. EBSD data is successively collected by individually positioning focused electron beams onto each pixel.

A normal line to a sample surface (the smoothened $\alpha$-$Al_2O_3$ layer) is inclined by 70° with respect to incident beams, and analysis is conducted at 15 kV. In order to avoid a charging effect, a pressure of 10 Pa is applied. A high current mode is set in conformity with a diameter of an opening of 60 μm or 120 μm. Data is collected stepwise at 0.1 μm/step, for 500×300 points corresponding to a plane region of 50×30 μm on the polished surface.

Data is processed with and without noise filtering. Noise filtering and crystal grain boundary character distribution are determined by using commercially available software (a trademark: "orientation Imaging microscopy Ver 6.2" manufactured by EDAX Inc.). The crystal grain boundary character distribution is analyzed based on data available from Grimmer (H. Grimmer, R. Bonnet, Philosophical Magazine A 61 (1990), 493-509). With Brandon criterion ($\Delta\Theta<\Theta_0(\Sigma)^{-0.5}$, where $\Theta_0=15°$), a tolerance of an experimental value from a theoretical value is taken into account (D. Brandon Acta metall. 14 (1966), 1479-1484). Special crystal grain boundaries corresponding to any $\Sigma$ value are counted, and the count is expressed as a ratio to all crystal grain boundaries. Namely, as set forth above, the length of the $\Sigma3$ crystal grain boundary, the length of the $\Sigma3$-29 crystal grain boundary, and the total length of all grain boundaries can be found.

Whether or not the $\alpha$-$Al_2O_3$ layer shows (001) orientation can be determined as follows. After the $\alpha$-$Al_2O_3$ layer is cut to obtain a cross-section perpendicular to the $\alpha$-$Al_2O_3$ layer similarly to the above, polishing and smoothing treatment are similarly carried out.

Then, whether or not the $\alpha$-$Al_2O_3$ layer shows (001) orientation in the cut surface thus treated is determined with an SEM with EBSD as above. Specifically, with software the same as the above, an angle formed between a direction of normal to the (001) plane of each measured pixel and a direction of normal to the surface of the $\alpha$-$Al_2O_3$ layer (the surface located on the surface side of the coating) (that is, the linear direction in parallel to the direction of thickness of the $\alpha$-$Al_2O_3$ layer at the cut surface) is calculated, and a color map in which a pixel having the angle within ±20° is selected is created. In this case, the color map is created over the entire surface of the cut surface (that is, the $\alpha$-$Al_2O_3$ layer).

Specifically, with the technique according to "Crystal Direction MAP" included in the software, a color map of Tolerance of 20° (a difference in direction being within) ±20° between the direction of normal to the surface of the $\alpha$-$Al_2O_3$ layer and the direction of normal to the (001) plane of each measured pixel is created. Then, an area ratio of the pixel is calculated based on this color map and the area ratio being 50% or higher is defined as "the $\alpha$-$Al_2O_3$ layer showing (001) orientation."

<Thickness of $\alpha$-$Al_2O_3$ Layer>

The $\alpha$-$Al_2O_3$ layer preferably has a thickness from 2 to 20 μm. The excellent effect as above can thus be exhibited. The thickness is more preferably from 3 to 15 μm and further preferably from 5 to 10 μm.

When the thickness is smaller than 2 μm, the excellent effect as above may not sufficiently be exhibited. When the thickness exceeds 20 μm, interface stress attributed to a difference in coefficient of linear expansion between the $\alpha$-$Al_2O_3$ layer and another layer such as an underlying layer increases and crystal grains of $\alpha$-$Al_2O_3$ may come off. Such a thickness can be determined by observing a vertical cross-section of the base material and the coating with a scanning electron microscope (SEM).

<Surface Roughness of $\alpha$-$Al_2O_3$ Layer>

The $\alpha$-$Al_2O_3$ layer has surface roughness Ra preferably less than 0.2 μm. Thus, not only a coefficient of friction between chips and a cutting edge of a tool lowers and resistance to chipping improves but also stable capability to discharge chips can be exhibited. Surface roughness Ra is more preferably less than 0.15 μm and further preferably less than 0.10 μm. Surface roughness Ra is thus preferably as low as possible, and a lower limit thereof does not have to be defined. From a point of view of the fact that a coating is affected by a surface texture of the base material, however, the lower limit is 0.05 μm or greater.

In the present application, surface roughness Ra means arithmetical mean roughness Ra defined under JIS B 0601 (2001).

<Compressive Stress of $\alpha$-$Al_2O_3$ Layer>

The $\alpha$-$Al_2O_3$ layer preferably includes a point where an absolute value for compressive stress is maximal, in a region within 2 μm from a surface side of the coating, and the absolute value for compressive stress at the point is lower than 1 GPa. Thus, sudden breakage of a cutting edge due to mechanical and thermal fatigue of the cutting edge of the tool which occurs during an intermittent cutting process is suppressed and a manpower saving/energy saving effect can be exhibited. The absolute value is more preferably lower than 0.9 GPa and further preferably lower than 0.8 GPa. Though the lower limit of the absolute value is not particularly limited, from a point of view of balance between resistance to wear and resistance to breakage, the lower limit is not lower than 0.2 GPa.

The "surface side of the coating" here means a side opposite to a side of the base material in the direction of thickness of the $\alpha$-$Al_2O_3$ layer, and when no other layer is formed on the $\alpha$-$Al_2O_3$ layer, it means the surface of the $\alpha$-$Al_2O_3$ layer.

Compressive stress in the present embodiment can be measured with the conventionally known $\sin^2 \psi$ method and constant penetration depth method which use X-rays.

<$TiC_xN_y$ Layer>

The coating according to the present embodiment can include a $TiC_xN_y$ layer between the base material and the $\alpha$-$Al_2O_3$ layer. This $TiC_xN_y$ layer preferably contains $TiC_xN_y$ satisfying atomic ratio relation of $0.6 \leq x/(x+y) \leq 0.8$. Adhesion between the base material and the $\alpha$-$Al_2O_3$ layer is thus improved.

The atomic ratio is more preferably $0.65 \leq x/(x+y) \leq 0.75$ and further preferably $0.67 \leq x/(x+y) \leq 0.72$. When $x/(x+y)$ is smaller than 0.6, resistance to wear may be insufficient, and when it exceeds 0.8, resistance to chipping may be insufficient.

<Manufacturing Method>

The surface-coated cutting tool according to the present embodiment can be manufactured by forming a coating on a base material through chemical vapor deposition. When a coating other than the $\alpha$-$Al_2O_3$ layer is formed in the coating, such a coating can be formed under conventionally known conditions. The $\alpha$-$Al_2O_3$ layer can be formed as below.

Initially, $AlCl_3$, HCl, $CO_2$, CO, $H_2S$, $O_2$, and $H_2$ are employed as source gases. Amounts of blend of $AlCl_3$, HCl, $CO_2$, CO, $H_2S$, and $O_2$ are set to 3 to 5 volume %, 4 to 6 volume %, 0.5 to 2 volume %, 0.1 to 1 volume %, 1 to 5 volume %, and 0.0001 to 0.01 volume %, respectively, and $H_2$ is adopted as the remainder. Volume ratios of $0.1 \leq CO/CO_2 \leq 1$, $0.1 \leq CO_2/H_2S \leq 1$, $0.1 \leq CO_2/AlCl_3 \leq 1$, and $0.5 \leq AlCl_3/HCl \leq 1$ are preferably adopted.

Various conditions for chemical vapor deposition include a temperature from 950 to 1050° C., a pressure from 1 to 5 kPa, and a gas flow rate (a total amount of gases) from 50 to 100 L/min.

After the $\alpha$-$Al_2O_3$ layer is thus once formed through chemical vapor deposition, annealing is performed. Conditions for annealing include a temperature from 1050 to 1080° C., a pressure from 50 to 100 kPa, and a time period from 120 to 300 minutes. An atmosphere for this annealing is obtained by feeding $H_2$ and argon (Ar) each at a flow rate of 20 to 30 L/min.

The $\alpha$-$Al_2O_3$ layer according to the present embodiment having a desired thickness can thus be formed. In particular, by setting a volume ratio of $O_2$ in the source gas to the range above, a sufficient rate of film formation can be ensured while the possibility of explosion is lowered. Annealing as above after film formation can prevent an impurity such as sulfur from remaining in the $\alpha$-$Al_2O_3$ layer. Therefore, the above method is particularly excellent as the method of manufacturing the $\alpha$-$Al_2O_3$ layer according to the present embodiment.

EXAMPLES

Though the present invention will be described in further detail below with reference to Examples, the present invention is not limited thereto.

<Preparation of Base Material>

Two types of base materials of a base material P and a base material K shown in Table 1 below were prepared. Specifically, a base material made of cemented carbide and having a shape of CNMG120408NUX (manufactured by Sumitomo Electric Industries, Ltd., JIS B4120 (2013)) was obtained by uniformly mixing source material powders as formulated as shown in Table 1, forming the powders into a prescribed shape by applying a pressure, and sintering the formed powders for 1 to 2 hours at 1300 to 1500° C.

TABLE 1

| | Formulated Composition (Mass %) | | | | | | |
|---|---|---|---|---|---|---|---|
| | Co | ZrC | VC | $Cr_3C_2$ | NbC | TaC | WC |
| P | 7.0 | 1.0 | — | — | 3.5 | 1.0 | Remainder |
| K | 5.0 | — | 0.3 | 0.5 | 1.0 | 2.0 | Remainder |

<Formation of Coating>

A coating was formed on a surface of each base material obtained as above. Specifically, a coating was formed on the base material through chemical vapor deposition, with the base material being set in a chemical vapor deposition apparatus. Conditions for forming the coating are as shown in Tables 2 and 3 below. Table 2 shows conditions for forming each layer other than the $\alpha$-$Al_2O_3$ layer, and Table 3 shows conditions for forming the $\alpha$-$Al_2O_3$ layer. TiBNO and TiCNO in Table 2 represent an intermediate layer in Table 5 which will be described later, and other components correspond to layers except for the $\alpha$-$Al_2O_3$ layer in Table 5. The $TiC_xN_y$ layer is composed of $TiC_xN_y$ in which an atomic ratio $x/(x+y)$ is set to 0.7.

As shown in Table 3, there are 10 conditions of A to G and X to Z for forming the $\alpha$-$Al_2O_3$ layer, and A to G correspond to the conditions in Examples and X to Z correspond to the conditions in Comparative Examples (conventional art).

Only the $\alpha$-$Al_2O_3$ layer in Examples formed under conditions A to G was annealed under conditions of 1050° C., 50 kPa, a flow rate of $H_2$ being set to 20 L/min., and a flow rate of Ar being set to 30 L/min. for an annealing time period shown in Table 4.

For example, formation condition A indicates that the $\alpha$-$Al_2O_3$ layer is formed by supplying a source gas composed of 3.2 volume % of $AlCl_3$, 4.0 volume % of HCl, 1.0 volume % of $CO_2$, 0.5 volume % of CO, 2 volume % of $H_2S$, 0.003 volume % of $O_2$, and remainder $H_2$ to the chemical vapor deposition apparatus, performing chemical vapor deposition under conditions of a pressure of 3.5 kPa, a temperature of 1000° C., and a flow rate (a total amount of gases) of 70 L/min., and thereafter performing annealing for 180 minutes under the conditions above.

Each layer other than the $\alpha$-$Al_2O_3$ layer shown in Table 2 was formed similarly through chemical vapor deposition, except for not performing annealing. The "remainder" in Table 2 indicates that $H_2$ occupies the remainder of the source gases. The "total amount of gases" indicates a total volume flow rate introduced into the chemical vapor deposition apparatus per unit time, with a gas in a standard condition (0° C. and 1 atmospheric pressure) being defined as the ideal gas (also applicable to the $\alpha$-$Al_2O_3$ layer in Table 3).

A composition and a thickness of each coating were determined with an SEM-EDX (scanning electron microscope-energy dispersive X-ray spectrometry), and a length of the $\Sigma 3$ crystal grain boundary, a length of the $\Sigma 3$-29 crystal grain boundary, and a total length of all grain boundaries of the $\alpha$-$Al_2O_3$ layer were determined with the method described above. Whether or not the $\alpha$-$Al_2O_3$ layer shows (001) orientation was also determined with the method described above.

Consequently, the composition and the thickness of each coating are as shown in Table 5, and how much % of the length of the $\Sigma 3$-29 crystal grain boundary and how much % of the total length of all grain boundaries the length of the $\Sigma 3$ crystal grain boundary of the $\alpha$-$Al_2O_3$ layer occupies are shown in fields of "$\Sigma 3/\Sigma 3$-29" and "$\Sigma 3$/all grain boundaries" in Table 4. A ratio (%) of crystal grains ($\alpha$-$Al_2O_3$) of which normal direction to the (001) plane is within ±20° with respect to the normal direction to the surface of the $\alpha$-$Al_2O_3$ layer (the surface located on the surface side of the coating) is similarly shown in a field of "ratio of (001) orientation" in Table 4.

TABLE 2

| | Composition of Source Gas (Volume %) | Conditions for Film Formation | | |
|---|---|---|---|---|
| | | Pressure (kPa) | Temperature (° C.) | Total Amount of Gases (L/min) |
| TiN (Underlying Layer) | $TiCl_4$ = 2.0%, $N_2$ = 39.7%, $H_2$ = Remainder | 30 | 900 | 50.0 |
| TiN (Outermost Layer) | $TiCl_4$ = 0.5%, $N_2$ = 41.2%, $H_2$ = Remainder | 79.8 | 1050 | 75.5 |
| $TiC_xN_y$ | $TiCl_4$ = 2.0%, $CH_3CN$ = 0.7%, $C_2H_4$ = 1.5%, $H_2$ = Remainder | 8 | 850 | 67.9 |
| TiBNO | $TiCl_4$ = 36.7%, $BCl_3$ = 0.1%, CO = 1.6%, $CO_2$ = 1.7%, $N_2$ = 61.7%, $H_2$ = Remainder | 6.7 | 980 | 56.2 |
| TiCNO | $TiCl_4$ = 2.1%, CO = 3.2%, $CH_4$ = 2.8%, $N_2$ = 23.7%, $H_2$ = Remainder | 16.0 | 1030 | 49.4 |

TABLE 3

| | | Composition of Source Gas (Volume %) | | | | | | | Composition of Source Gas (Volume Ratio) | | | | Conditions for Film Formation | | |
|---|---|---|---|---|---|---|---|---|---|---|---|---|---|---|---|---|
| | | $AlCl_3$ | HCl | $CO_2$ | CO | $H_2S$ | $O_2$ | $H_2$ | $CO/CO_2$ | $CO_2/H_2S$ | $CO_2/AlCl_3$ | $AlCl_3/HCl$ | Pressure (kPa) | Temperature (° C.) | Total Amount of Gases (L/min) |
| Example | A | 3.2 | 4.0 | 1.0 | 0.5 | 2 | 0.0030 | Remainder | 0.5 | 0.50 | 0.3 | 0.8 | 3.5 | 1000 | 70 |
| | B | 3.5 | 5.0 | 0.8 | 0.4 | 1.8 | 0.0060 | Remainder | 0.5 | 0.44 | 0.2 | 0.7 | 3.5 | 1000 | 70 |
| | C | 3.0 | 6.0 | 0.5 | 0.3 | 1.6 | 0.0800 | Remainder | 0.6 | 0.31 | 0.2 | 0.5 | 3.0 | 1010 | 60 |
| | D | 4.4 | 5.0 | 1.0 | 0.6 | 1.1 | 0.0005 | Remainder | 0.6 | 0.91 | 0.2 | 0.9 | 4.0 | 980 | 75 |
| | E | 5.2 | 6.0 | 1.6 | 0.8 | 2 | 0.0075 | Remainder | 0.5 | 0.80 | 0.3 | 0.9 | 3.5 | 1000 | 70 |
| | F | 3.8 | 4.5 | 2.0 | 1.0 | 3 | 0.0009 | Remainder | 0.5 | 0.67 | 0.5 | 0.8 | 4.0 | 980 | 80 |
| | G | 5.0 | 5.5 | 1.0 | 0.5 | 5 | 0.0100 | Remainder | 0.5 | 0.20 | 0.2 | 0.9 | 3.0 | 1020 | 60 |
| Comparative Example | X | 10 | 5.0 | 15 | — | 0.2 | — | Remainder | — | 75 | 1.5 | 2.0 | 5 | 1050 | 50 |
| | Y | 2 | 2.0 | 3 | — | 0.6 | — | Remainder | — | 5 | 1.5 | 1.0 | 8 | 1020 | 55 |
| | Z | 2 | 1.5 | 6 | — | 0.05 | — | Remainder | — | 120 | 3.0 | 1.3 | 6 | 1020 | 50 |

TABLE 4

| | | Time Period for Annealing (min) | Σ3/Σ3-29 (%) | Σ3/All Grain Boundaries (%) | Ratio of (001) Orientation (%) |
|---|---|---|---|---|---|
| Example | A | 180 | 90 | 34 | 60 |
| | B | 180 | 88 | 30 | 57 |
| | C | 120 | 93 | 36 | 64 |
| | D | 240 | 85 | 18 | 55 |
| | E | 180 | 85 | 20 | 50 |
| | F | 300 | 87 | 24 | 54 |
| | G | 180 | 98 | 42 | 75 |
| Comparative Example | X | — | 75 | 3 | 52 |
| | Y | — | 84 | 5 | 44 |
| | Z | — | 50 | 1 | 13 |

<Fabrication of Surface-Coated Cutting Tool>

Surface-coated cutting tools in Examples 1 to 15 and Comparative Examples 1 to 6 shown in Table 5 below were each fabricated by forming a coating on the base material under the conditions in Tables 2 to 4. A thickness of each layer was adjusted by adjusting as appropriate a time period for film formation (a rate of film formation of each layer was approximately from 0.5 to 2.0 μm/hour).

For example, the surface-coated cutting tool in Example 4 has a coating having a total thickness of 12.0 μm formed on the base material, by adopting base material P shown in Table 1 as the base material, forming a TiN layer having a thickness of 0.5 μm as an underlying layer on the surface of base material P under the conditions in Table 2, forming a $TiC_xN_y$ layer having a thickness of 5.0 μm on the underlying layer under the conditions in Table 2, forming a TiBNO layer having a thickness of 0.5 μm as an intermediate layer on the $TiC_xN_y$ layer under the conditions in Table 2, fabricating the α-$Al_2O_3$ layer having a thickness of 5.0 μm on the intermediate layer under formation condition B in Tables 3 and 4, and thereafter forming a TiN layer having a thickness of 1.0 μm as an outermost layer under the conditions in Table 2. In the α-$Al_2O_3$ layer of the surface-coated cutting tool in Example 4, a length of the Σ3 crystal grain boundary is 88% of the length of the Σ3-29 crystal grain boundary and 30% of the total length of all grain boundaries. This α-$Al_2O_3$ layer shows (001) orientation (that is, a ratio of crystal grains (α-$Al_2O_3$) of which normal direction to the (001) plane is within ±20° with respect to the normal direction to the surface of the α-$Al_2O_3$ layer is 57% in the α-$Al_2O_3$ layer).

Since the α-$Al_2O_3$ layer in each of Comparative Examples 1 to 6 was formed under the conditions according to the conventional art which are not in accordance with the method of the present invention, this α-$Al_2O_3$ layer was formed of a crystal texture not exhibiting characteristics as in the present invention (see Tables 3 and 4).

Blank fields in Table 5 indicate absence of a corresponding layer.

TABLE 5

| | Type of Base Material | Construction of Coating (μm) | | | | | Total Thickness of Coating (μm) |
|---|---|---|---|---|---|---|---|
| | | Underlying Layer (TiN layer) | TiC$_x$N$_y$ Layer | Intermediate Layer | α-Al$_2$O$_3$ Layer | Outermost Layer (TiN layer) | |
| Example 1 | P | 0.5 | 9.0 | TiBNO (0.5) | A (7.0) | — | 17.0 |
| Example 2 | P | 0.5 | 9.0 | TiCNO (0.5) | C (7.0) | — | 17.0 |
| Example 3 | P | 0.5 | 10.5 | TiBNO (0.5) | E (11.0) | 0.5 | 23.0 |
| Example 4 | P | 0.5 | 5.0 | TiBNO (0.5) | B (5.0) | 1.0 | 12.0 |
| Example 5 | P | 0.5 | 9.0 | TiCNO (0.5) | F (7.0) | — | 17.0 |
| Example 6 | P | 0.5 | 6.0 | TiCNO (0.5) | D (2.0) | — | 9.0 |
| Example 7 | P | 0.5 | 13.0 | TiCNO (0.5) | G (13.5) | 1.0 | 28.5 |
| Example 8 | K | 0.5 | 15.5 | TiCNO (0.5) | D (10.0) | — | 26.5 |
| Example 9 | K | 0.5 | 5.0 | TiBNO (0.5) | A (8.0) | 0.8 | 14.8 |
| Example 10 | K | 0.5 | 12.5 | TiCNO (0.5) | G (14.0) | 1.0 | 28.5 |
| Example 11 | K | 0.5 | 9.0 | TiCNO (0.5) | F (7.0) | — | 17.0 |
| Example 12 | K | 0.5 | 9.5 | TiBNO (0.5) | C (6.5) | 1.0 | 18.0 |
| Example 13 | K | 0.5 | 10.5 | TiCNO (0.5) | E (11.0) | 0.5 | 23.0 |
| Example 14 | K | 0.5 | 5.0 | TiCNO (0.5) | B (3.0) | — | 9.0 |
| Example 15 | K | 0.5 | 6.0 | TiCNO (0.5) | D (20.0) | — | 27.0 |
| Comparative Example 1 | P | 0.5 | 9.0 | TiCNO (0.5) | X (7.0) | — | 17.0 |
| Comparative Example 2 | P | 0.5 | 9.0 | TiCNO (0.5) | Y (7.0) | — | 17.0 |
| Comparative Example 3 | P | 0.5 | 9.0 | TiCNO (0.5) | Z (7.0) | — | 17.0 |
| Comparative Example 4 | K | 0.5 | 9.0 | TiCNO (0.5) | X (7.0) | — | 17.0 |
| Comparative Example 5 | K | 0.5 | 9.0 | TiCNO (0.5) | Y (7.0) | — | 17.0 |
| Comparative Example 6 | K | 0.5 | 9.0 | TiCNO (0.5) | Z (7.0) | — | 17.0 |

<Cutting Test>

Five types of cutting tests below were conducted on the surface-coated cutting tools obtained above.

<Cutting Test 1>

For the surface-coated cutting tools in Examples and Comparative Examples shown in Table 6 below, under cutting conditions below, a time period of cutting until an amount of wear of the flank face (Vb) reached 0.20 mm was counted and a final form of damage of a cutting edge was observed. Table 6 shows results. A longer time period of cutting indicates better resistance to wear and longer life of the tool. The final form of damage shown as wear indicates good resistance to chipping and similarly longer life of the tool.

<Conditions for Cutting>

Work material: Cutting of outer circumference of round rod of SUJ2
Peripheral speed: 350 m/min.
Feed rate: 0.2 mm/rev
Cutting depth: 2.0 mm
Coolant: used

TABLE 6

| | Time Period of Cutting (Minute) | Final Form of Damage |
|---|---|---|
| Example 1 | 40 | Wear |
| Example 2 | 43 | Wear |
| Example 3 | 38 | Wear |
| Example 4 | 37 | Wear |
| Example 5 | 33 | Wear |
| Example 6 | 25 | Wear |
| Example 7 | 35 | Wear |
| Comparative Example 1 | 13 | Chipping |
| Comparative Example 2 | 20 | Wear |
| Comparative Example 3 | 10 | Chipping |

As is clear from Table 6, the surface-coated cutting tools in Examples are better in both of resistance to wear and resistance to chipping and longer in life of the tool than the surface-coated cutting tools in Comparative Examples. Namely, it could be confirmed that mechanical characteristics of the coating in the surface-coated cutting tools in Examples were improved.

<Cutting Test 2>

For the surface-coated cutting tools in Examples and Comparative Examples shown in Table 7 below, under cutting conditions below, a time period of cutting until an amount of wear of the flank face (Vb) reached 0.20 mm was counted and a final form of damage of a cutting edge was observed. Table 7 shows results. A longer time period of cutting indicates better resistance to wear and longer life of the tool. The final form of damage shown as wear indicates good resistance to chipping and similarly longer life of the tool.

<Conditions for Cutting>

Work material: Cutting of outer circumference of round rod of S50C
Peripheral speed: 300 m/min.
Feed rate: 0.5 mm/rev
Cutting depth: 2.0 mm
Coolant: used

TABLE 7

| | Time Period of Cutting (Minute) | Final Form of Damage |
|---|---|---|
| Example 1 | 37 | Wear |
| Example 2 | 39 | Wear |
| Example 4 | 35 | Wear |
| Example 5 | 30 | Wear |
| Comparative Example 1 | 10 | Wear |
| Comparative Example 2 | 24 | Wear |
| Comparative Example 3 | 17 | Wear |

As is clear from Table 7, the surface-coated cutting tools in Examples are better in resistance to wear and longer in life of the tool than the surface-coated cutting tools in Comparative Examples. Namely, it could be confirmed that mechanical characteristics of the coating in the surface-coated cutting tools in Examples were improved.

<Cutting Test 3>

For the surface-coated cutting tools in Examples and Comparative Examples shown in Table 8 below, under cutting conditions below, a time period of cutting until an amount of wear of the flank face (Vb) reached 0.20 mm was counted and a final form of damage of a cutting edge was observed. Table 8 shows results. A longer time period of cutting indicates better resistance to wear and longer life of the tool. The final form of damage shown as wear indicates good resistance to chipping and similarly longer life of the tool.

<Conditions for Cutting>

Work material: Cutting of outer circumference of round rod of FCD600

Peripheral speed: 300 m/min.

Feed rate: 0.3 mm/rev

Cutting depth: 1.5 mm

Coolant: used

TABLE 8

|  | Time Period of Cutting (Minute) | Final Form of Damage |
|---|---|---|
| Example 8 | 20 | Wear |
| Example 9 | 15 | Wear |
| Example 10 | 27 | Wear |
| Example 11 | 20 | Wear |
| Example 12 | 25 | Wear |
| Example 13 | 23 | Wear |
| Example 14 | 16 | Wear |
| Example 15 | 12 | Wear |
| Comparative Example 4 | 5 | Chipping |
| Comparative Example 5 | 8 | Chipping |
| Comparative Example 6 | 5 | Chipping |

As is clear from Table 8, the surface-coated cutting tools in Examples are better in both of resistance to wear and resistance to chipping and longer in life of the tool than the surface-coated cutting tools in Comparative Examples. Namely, it could be confirmed that mechanical characteristics of the coating in the surface-coated cutting tools in Examples were improved.

<Cutting Test 4>

For the surface-coated cutting tools in Examples and Comparative Examples shown in Table 9 below, under cutting conditions below, a time period of cutting until an amount of wear of the flank face (Vb) reached 0.20 mm was counted and a final form of damage of a cutting edge was observed. Table 9 shows results. A longer time period of cutting indicates better resistance to wear and longer life of the tool. The final form of damage shown as wear indicates good resistance to chipping and similarly longer life of the tool.

<Conditions for Cutting>

Work material: Cutting of outer circumference of round rod of FC200

Peripheral speed: 500 m/min.

Feed rate: 0.25 mm/rev

Cutting depth: 1.5 mm

Coolant: used

TABLE 9

|  | Time Period of Cutting (Minute) | Final Form of Damage |
|---|---|---|
| Example 9 | 16 | Wear |
| Example 11 | 14 | Wear |
| Example 12 | 17 | Wear |
| Example 14 | 15 | Wear |
| Example 15 | 12 | Wear |
| Comparative Example 4 | 7 | Wear |
| Comparative Example 5 | 9 | Wear |
| Comparative Example 6 | 7 | Wear |

As is clear from Table 9, the surface-coated cutting tools in Examples are better in resistance to wear and longer in life of the tool than the surface-coated cutting tools in Comparative Examples. Namely, it could be confirmed that mechanical characteristics of the coating in the surface-coated cutting tools in Examples were improved.

<Cutting Test 5>

For the surface-coated cutting tools in Examples and Comparative Examples shown in Table 10 below, a time period of cutting until the tool is broken under cutting conditions below was counted. Table 10 shows results. A longer time period of cutting indicates better resistance to breakage and longer life of the tool.

<Conditions for Cutting>

Work material: SCM440 (cutting of outer circumference of 90°×4 grooves)

Peripheral speed: 200 m/min.

Feed rate: 0.2 mm/rev

Cutting depth: 1.5 mm

Coolant: used

TABLE 10

|  | Time Period of Cutting (Minute) |
|---|---|
| Example 1 | 5.0 |
| Example 2 | 5.0 |
| Example 4 | 4.8 |
| Example 5 | 4.5 |
| Comparative Example 1 | 2.5 |
| Comparative Example 2 | 3.0 |
| Comparative Example 3 | 1.0 |
| Example 9 | 3.0 |
| Example 11 | 2.8 |
| Example 12 | 3.5 |
| Example 14 | 2.8 |
| Example 15 | 2.5 |
| Comparative Example 4 | 0.8 |
| Comparative Example 5 | 1.0 |
| Comparative Example 6 | 0.5 |

As is clear from Table 10, the surface-coated cutting tools in Examples are better in resistance to breakage and longer in life of the tool than the surface-coated cutting tools in Comparative Examples. Namely, it could be confirmed that mechanical characteristics of the coating in the surface-coated cutting tools in Examples were improved.

<Confirmation of Effect of Surface Roughness Ra of α-$Al_2O_3$ Layer>

Surface roughness Ra of the α-$Al_2O_3$ layer in the surface-coated cutting tools in Examples 1, 2, and 11 was measured under JIS B 0601 (2001). Table 11 shows results.

Then, surface-coated cutting tools in Examples 1A, 2A, and 11A were fabricated by subjecting the α-$Al_2O_3$ layer of each surface-coated cutting tool to aerolap treatment under conditions below. Surface roughness Ra of the α-$Al_2O_3$ layer in the surface-coated cutting tool was measured similarly to the above. Table 11 shows results.

<Conditions for Aerolap Treatment>

Media: elastic rubber media with a diameter of approximately 1 mm, which contain diamond grains having an average grain size of 0.1 μm (a trademark: "MultiCone" manufactured by Yamashita Works Co., Ltd.).

Projection pressure: 0.5 bar
Time period of projection: 30 seconds
Wet/dry: dry

For the surface-coated cutting tools in Examples 1, 1A, 2, 2A, 11, and 11A, a time period of cutting until an amount of wear of the flank face (Vb) reached 0.20 mm under cutting conditions below was counted. Table 11 shows results. A longer time period of cutting indicates stable capability to discharge chips, with a coefficient of friction between chips and the cutting edge of the tool being lower.

<Conditions for Cutting>

Work material: Cutting of outer circumference of round rod of SS400
Peripheral speed: 100 m/min.
Feed rate: 0.1 mm/rev
Cutting depth: 1.0 mm
Coolant: not used

TABLE 11

|  | Surface Roughness Ra (μm) | Time Period of Cutting (Minute) |
| --- | --- | --- |
| Example 1 | 0.33 | 27 |
| Example 1A | 0.12 | 40 |
| Example 2 | 0.30 | 30 |
| Example 2A | 0.10 | 53 |
| Example 11 | 0.28 | 35 |
| Example 11A | 0.10 | 60 |

As is clear from Table 11, it could be confirmed that the surface-coated cutting tools in Examples 1A, 2A, and 11A including the α-$Al_2O_3$ layer having surface roughness Ra less than 0.2 μm could achieve lowering in coefficient of friction between chips and the cutting edge of the tool and exhibited stable capability to discharge chips, as compared with the surface-coated cutting tools in Examples 1, 2, and 11 including the α-$Al_2O_3$ layer having surface roughness Ra equal to or more than 0.2 μm.

<Confirmation of Effect of Compressive Stress Provided to α-$Al_2O_3$ Layer>

For the surface-coated cutting tools in Examples 1, 2, and 11, it was confirmed that there was a point where an absolute value for stress was maximal, in a region within 2 μm from the surface side of the coating in the α-$Al_2O_3$ layer, and the absolute value of stress at that point was measured. Table 12 shows results (in a field of "stress value"). Stress was measured with the $\sin^2 \psi$ method using X-rays, and a numeric value in the field of "stress value" in Table 12 shows an absolute value, with tensile stress being denoted as "tensile" and compressive stress being denoted as "compressive".

Then, surface-coated cutting tools in Examples 1B, 1C, 2B, 2C, and 11B were fabricated by subjecting the α-$Al_2O_3$ layer of each surface-coated cutting tool to wet blast treatment under conditions below. Then, for each surface-coated cutting tool, similarly to the above, it was confirmed that there was a point where an absolute value of stress was maximal, in a region within 2 μm from the surface side of the coating in the α-$Al_2O_3$ layer, and the absolute value of stress at that point was measured. Table 12 shows results (in a field of "stress value"). Difference in stress between Example 1B and Example 1C and between Example 2B and Example 2C is attributed to a difference in projection pressure in wet blast treatment.

<Conditions for Wet Blast Treatment>

Media: alumina media (φ 50 μm)
Projection pressure: 1 to 2 bar
Time period of projection: 10 seconds
Wet/dry: Wet A time period of cutting until the tool is broken under conditions for cutting below was counted for the surface-coated cutting tools in Examples 1, 1B, 1C, 2, 2B, 2C, 11, and 11B. Table 12 shows results. A longer time period of cutting indicates suppression of breakage of the cutting edge of the tool due to mechanical and thermal fatigue which occurs during an intermittent cutting process and resultant improvement in reliability of the cutting edge.

<Conditions for Cutting>

Work material: SUS304 (cutting of outer circumference of 60°×3 grooves)
Peripheral speed: 150 m/min.
Feed rate: 0.25 mm/rev
Cutting depth: 1.0 mm
Coolant: not used

TABLE 12

|  | Stress Value (GPa) | Time Period of Cutting (Minute) |
| --- | --- | --- |
| Example 1 | 0.7 (Tensile) | 12 |
| Example 1B | 0.8 (Compressive) | 22 |
| Example 1C | 1.0 (Compressive) | 20 |
| Example 2 | 0.8 (Tensile) | 10 |
| Example 2B | 0.6 (Compressive) | 20 |
| Example 2C | 0.2 (Compressive) | 14 |
| Example 11 | 0.6 (Tensile) | 15 |
| Example 11B | 0.8 (Compressive) | 27 |

As is clear from Table 12, it could be confirmed that a point where the absolute value of stress was maximal was included in the region within 2 μm from the surface side of the coating in the α-$Al_2O_3$ layer, breakage of the cutting edge of the tool due to mechanical and thermal fatigue which occurred during an intermittent cutting process was suppressed in a case that stress at that point was compressive stress of which absolute value was smaller than 1 GPa as compared with a case that stress at that point was tensile stress, and consequently reliability of the cutting edge was improved.

Though the embodiment and the examples of the present invention have been described above, combination of features in each embodiment and example described above as appropriate and various modifications thereof are also originally intended.

It should be understood that the embodiment disclosed herein is illustrative and non-restrictive in every respect. The scope of the present invention is defined by the terms of the claims, rather than the embodiment above, and is intended to include any modifications within the scope and meaning equivalent to the terms of the claims.

The invention claimed is:

1. A surface-coated cutting tool, comprising:
a base material; and
a coating formed on the base material,
the coating including an α-$Al_2O_3$ layer,
the α-$Al_2O_3$ layer including a plurality of crystal grains of α-$Al_2O_3$ and showing (001) orientation, a grain boundary of the crystal grains including a CSL grain boundary and a general grain boundary, a length of a Σ3 crystal grain boundary out of the CSL grain boundary exceeding 80% of a length of a Σ3-29 crystal grain boundary and being equal to or more than 10% and equal to or less than 50% of a total length of all grain boundaries which is a sum of the length of the Σ3-29 crystal grain boundary and a length of the general grain boundary, and the (001) orientation being defined as such a condition that a ratio of the crystal grains of α-$Al_2O_3$ of which normal direction to a (001) plane is within ±20° with respect to a normal direction to a surface of the α-$Al_2O_3$ layer is not lower than 50% in the α-$Al_2O_3$ layer.

2. The surface-coated cutting tool according to claim 1, wherein the CSL grain boundary is constituted of the Σ3 crystal grain boundary, a Σ7 crystal grain boundary, a Σ11 crystal grain boundary, a Σ17 crystal grain boundary, a Σ19 crystal grain boundary, a Σ21 crystal grain boundary, a Σ23 crystal grain boundary, and a Σ29 crystal grain boundary, and the length of the Σ3-29 crystal grain boundary is a total sum of lengths of the Σ3 crystal grain boundary, the Σ7 crystal grain boundary, the Σ11 crystal grain boundary, the Σ17 crystal grain boundary, the Σ19 crystal grain boundary, the Σ21 crystal grain boundary, the Σ23 crystal grain boundary, and the Σ29 crystal grain boundary which constitute the CSL grain boundary.

3. The surface-coated cutting tool according to claim 1, wherein the α-$Al_2O_3$ layer has a thickness from 2 to 20 μm.

4. The surface-coated cutting tool according to claim 1, wherein the α-$Al_2O_3$ layer has surface roughness Ra less than 0.2 μm.

5. The surface-coated cutting tool according to claim 1, wherein the α-$Al_2O_3$ layer includes a point where an absolute value for compressive stress is maximal, in a region within 2 μm from a surface side of the coating, and the absolute value for compressive stress at the point is lower than 1 GPa.

6. The surface-coated cutting tool according to claim 1, wherein the coating includes a $TiC_xN_y$ layer between the base material and the α-$Al_2O_3$ layer, and the $TiC_xN_y$ layer contains $TiC_xN_y$ satisfying atomic ratio relation of $0.6 \leq x/(x+y) \leq 0.8$.

7. The surface-coated cutting tool according to claim 1, wherein the length of the Σ3 boundary is obtained from a cross-section formed when the α-$Al_2O_3$ layer is cut along a plane including the normal line to a surface of the α-$Al_2O_3$ layer.

* * * * *